United States Patent [19]

Brauchle

[11] Patent Number: 5,770,947
[45] Date of Patent: Jun. 23, 1998

[54] ARRANGEMENT FOR TESTING A GATE OXIDE

[75] Inventor: Peter Brauchle, Nehren, Germany

[73] Assignee: Robert Bosch GmbH, Stuttgart, Germany

[21] Appl. No.: 619,755

[22] PCT Filed: Oct. 6, 1994

[86] PCT No.: PCT/DE94/01199

§ 371 Date: Mar. 27, 1996

§ 102(e) Date: Mar. 27, 1996

[87] PCT Pub. No.: WO95/10785

PCT Pub. Date: Apr. 20, 1995

[30] Foreign Application Priority Data

Oct. 13, 1993 [DE] Germany .................... 43 34 856.4

[51] Int. Cl.⁶ .................................................. G01R 31/26
[52] U.S. Cl. ...................... 324/765; 324/537; 324/763
[58] Field of Search ..................... 324/537, 763, 324/765, 766; 257/48

[56] References Cited

U.S. PATENT DOCUMENTS

| | | |
|---|---|---|
| 4,743,841 | 5/1988 | Takeuchi .................................. 324/765 |
| 4,853,628 | 8/1989 | Gouldsberry et al. ................... 324/763 |
| 5,068,604 | 11/1991 | Van De Lagemaat ................... 324/537 |
| 5,561,373 | 10/1996 | Itoh ........................................... 324/765 |
| 5,654,863 | 8/1997 | Davies .................................. 324/765 X |

FOREIGN PATENT DOCUMENTS 2288366 11/1990 Japan .

*Primary Examiner*—Glenn W. Brown
*Attorney, Agent, or Firm*—Michael J. Striker

[57] ABSTRACT

A circuit arrangement has an integrated monocrystaline semiconductor power component having a gate, a first measuring pad, a second measuring pad, and a resistor arranged so that the gate of the power component is connected with the first measuring pad while the first measuring pad is connected with the resistor, the first measuring pad being charged with a gate test voltage which is greater than a gate voltage required for operation of the power component, the power component being integrated with an integrated circuit on a chip, the integrated circuit being connected with the second measuring pad, while the second measuring pad is connected with the resistor, the second measuring pad being charged with an external voltage which is compatible with the integrated circuit.

6 Claims, 2 Drawing Sheets

ARRANGEMENT FOR TESTING A GATE OXIDE

BACKGROUND OF THE INVENTION

The invention relates to an arrangement for testing a gate oxide of a power component in accordance with MOS technology integrated into a monolithic integrated circuit.

Integrated circuits, which are combined with a power MOS end stage and which are housed in a single monocrystalline semiconductor body made of silicon, are already known. Since it is possible in the course of future applications that the blocking ability of the gate oxide of the power MOS end stage can decrease because of aging processes, it is necessary to test the gate oxide. Testing of the gate oxide is performed in that a voltage, which is higher than those which will occur in later applications, is applied to the gate oxide. Gate oxides of approximately 50 nanometers are customarily employed. These gate oxides have an intrinsic breakdown at a voltage of approximately 45 Volt. This means that with higher voltages an electrical breakdown would take place, which would result in field failures and thus in the destruction of the power MOS end stage. In applications the gate voltage is limited to $U_G$ less than/equal to 15 Volt. If these gates are now tested by means of a gate voltage of $U_G$=25 Volt it is accomplished that only those power MOS end stages are recognized as dependable, in which weak points do not result in field failures, as long as the blocking capability does not decrease by more than 10 Volt during their service life.

This manner of proceeding with a test is easily possible in connection with discrete power MOS components, since the gate is directly accessible as measuring pad. During wafer measurements it is thus possible to test the gate oxide for blocking capability directly by means of a higher voltage than would occur later during their employment. However, the mentioned test is not possible with monolithic integrated circuits with integrated power MOS components, because the gate of the power MOS element is disposed inside the chip and is not freely accessible for measurements by means of excess voltage. Measuring the entire integrated circuit with excess voltage would lead to the destruction of the further components of the integrated circuit. These could be, for example, the protective structures of the power MOS components used as excess voltage protection in particular, for example Zener diodes.

It is furthermore already known to perform a gate oxide test in connection with integrated circuits in such a way that the gate oxide quality is judged with the aid of test structures. However, it is disadvantageous in this connection that it is necessary to additionally provide a large surface on the wafers which is subjected to a test in place of the integrated gate oxides. However, this measurement by means of test structures is not economically useful, since too large a surface on the wafer is required for a statistically based statement of the gate oxide quality.

SUMMARY OF THE INVENTION

In contrast to this, the arrangement for testing a gate oxide with the features of the invention has the advantage that, on the one hand, a gate oxide test can be performed with a sufficiently high test voltage without the other components disposed in the integrated circuit being excessively stressed and that, on the other hand, it is possible to do without the additional disposition of test structures on the corresponding wafer. Because a series circuit consisting of a first measuring pad, a resistor and a second measuring pad is disposed between the gate oxide of the power component and the integrated circuit, an appropriately high gate test voltage can be applied to the first measuring pad, while an application or operating voltage can be applied to the second measuring pad, and the difference between the gate measuring voltage and the application voltage is absorbed by the resistor. By means of this it is achieved in a simple manner that the gate oxide of the power MOS end stage can be tested by means of a sufficiently high test voltage which-as already mentioned-assures that no weak points, which could result in field failures, will be present in the delivered components during later application. Because the voltage difference between the gate test voltage and the operating voltage is absorbed by the resistor, it is possible to protect the remaining portion of the integrated circuit from the gate test voltage, which constitutes an excess voltage, so that damages are not possible.

BRIEF DESCRIPTION OF THE DRAWINGS

The invention will be described in detail below in exemplary embodiments by means of the associated drawings. Shown are in.

DESCRIPTION OF THE PREFERRED EMBODIMENTS

Figure 1:
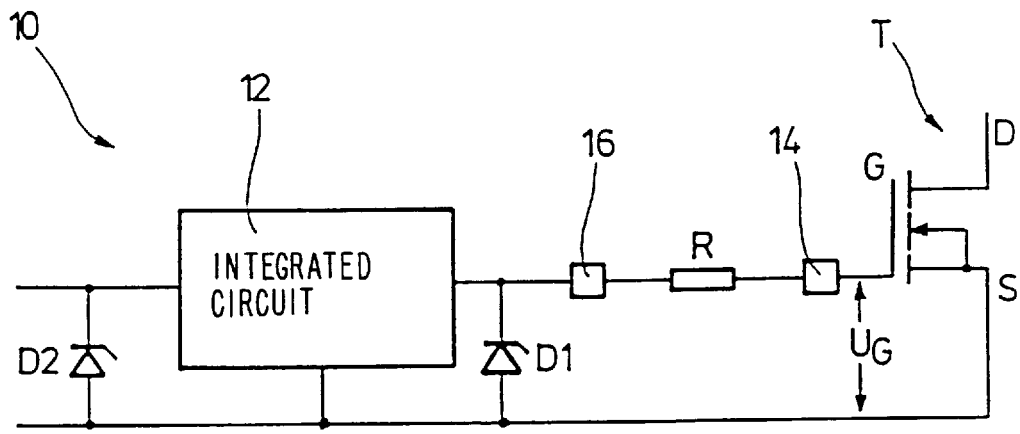
FIG. 1, a circuit arrangement for an integrated circuit with an arrangement for testing a gate oxide.

A circuit arrangement 10 having an integrated circuit 12, for example a logic circuit, not further specified here, is represented in FIG. 1. The circuit arrangement 10 furthermore has a MOSFET power transistor T, whose source connecting terminal is identified by S, whose drain connecting terminal by D and whose gate by G. A series circuit consisting of a first measuring pad 14, a poly-resistor R and a second measuring pad 16 is disposed between the gate G of the transistor T and the integrated circuit 12. Measuring pad here identifies a metal surface which is suitable for the attachment of pin electrodes for applying a test voltage and which is conducted outside the chip. Two Zener diodes D1 and D2, which have a breakdown voltage of, for example, 8 Volt and constitute an excess voltage protection for the integrated circuit 12 which need not be further considered here, are furthermore disposed parallel with the integrated circuit. Testing of the gate oxide of the gate G is performed in that a gate test voltage $U_G$ is applied between the first measuring pad 14 and the source connecting terminal S. This gate test voltage $U_G$ can be 25 Volt, for example. Since the application voltage in the example is 8 Volt, the integrated circuit 12 can be protected from an overload by applying a voltage to the second measuring pad 16 which is less than 8 Volt. In this case the difference between the gate measuring voltage $U_G$ and the application voltage is absorbed by the poly-resistor R disposed between the measuring pads 14 and 16. Thus it is assured by this that, on the one hand, the gate oxide of the gate G can be charged with the increased test voltage and, on the other hand, the remaining components of the entire circuit arrangement 10, in particular the integrated circuit 12, are protected against an overload by the increased gate test voltage $U_G$. But the gate oxide can be tested with a necessary safety gap in respect to the actual blocking voltage, so that it is possible to remove those integrated circuits in which the blocking capability of the gate oxide can be reduced to such an extent, for example by aging processes, that weak spots can result in field failures.

Figure 2:
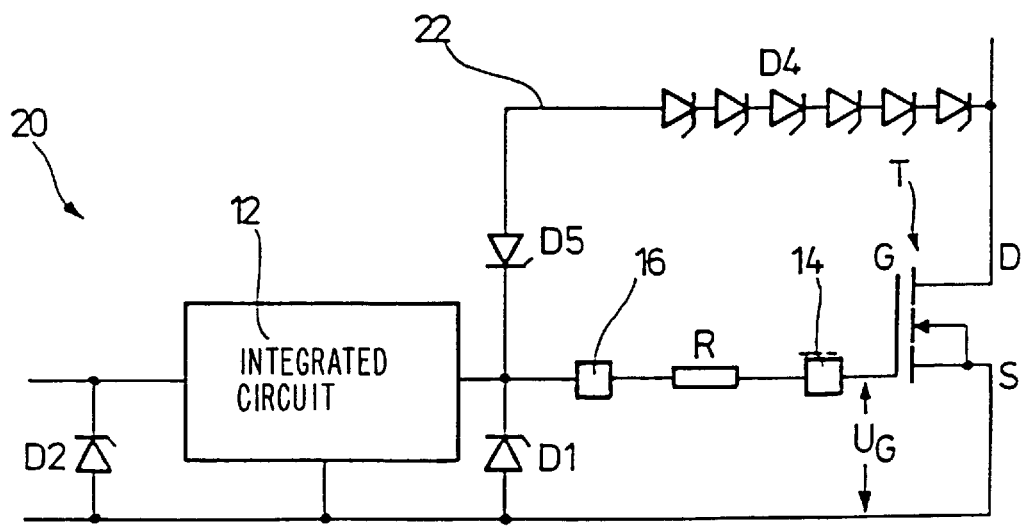
FIG. 2, is a circuit arrangement in a further embodiment variation.

A circuit arrangement 20 is represented in FIG. 2 wherein, in addition to the circuit arrangement represented in FIG. 1, a protective structure as protection of the MOSFET transistor T against excess voltage is disposed. This protective structure, identified as bracket branch 22, consists of a series circuit of Zener diodes D4 and of a Zener diode D5 connected with them. The further structure of the circuit is the same as in FIG. 1 and is not explained here again. In the represented variant, the bracket branch 22 is connected between the measuring pad 16 and the integrated circuit 12. Thus it is possible by means of this arrangement to perform the testing of the gate oxide in the same way as already described in FIG. 1. This is possible in particular because by the application of a voltage which is compatible with the integrated circuit 12 to the measuring pad 16, the bracket branch 22 is protected at the same time against the higher gate measuring voltage UG applied to the measuring pad 14.

Figure 3:
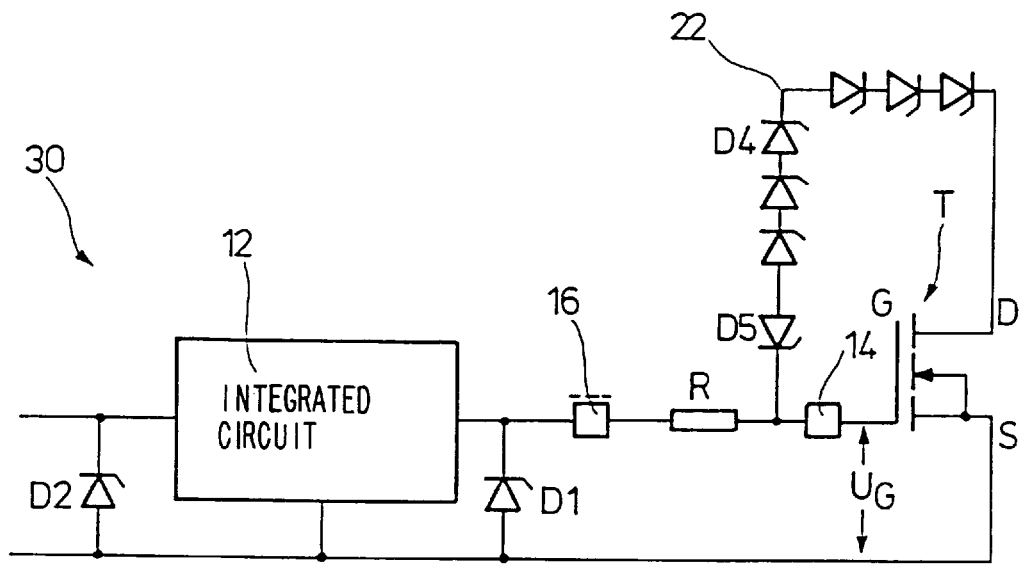
FIG. 3, is a circuit arrangement in a further embodiment variation.

With the circuit arrangement 30 represented in FIG. 3, which is analogous to the circuit arrangement 20 represented in FIG. 2, wherein like parts are again provided with the same reference numerals, the bracket branch 22 is connected directly to the gate G of the transistor T. Since the bracket branch 22 constitutes an excess voltage protection. i.e. voltage limitation, for the transistor T, the size of the gate test voltage $U_G$ is limited by the blocking capability of the connected diode 5 in this case.

It should be noted in connection with the circuit arrangements represented in FIGS. 1 to 3 that the switching speed of the transistor T is affected by the additional disposition of the poly-resistor R, so that this must be appropriately taken into account in connection with the size of the component. Further than that, because of the disposition of the poly-resistor R in a circuit arrangement with a bracket branch 22, it should be noted that the function of the bracket branch 22, i.e. the reaction capability to an applied overvoltage, is slowed by the poly-resistor R.

Figure 4:
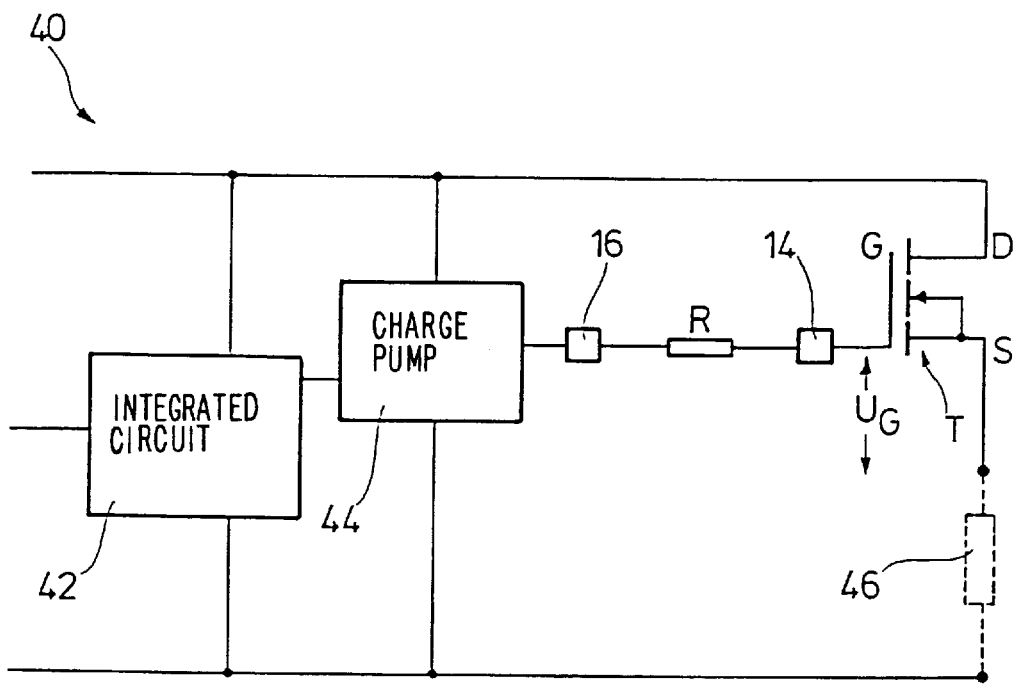
FIG. 4, is a circuit arrangement in a further embodiment variation.

A special circuit arrangement 40 is represented in FIG. 4, wherein the MOSFET transistor T is embodied as a high-side switch. An integrated circuit 42 is connected directly with the gate G of the transistor T via a charge pump 44 and the series circuit consisting of the first measuring pad 14, the poly-resistor R and the second measuring pad 16. An external load 46 can be switched in or out by switching the transistor T in a manner not to be considered here in more.detail. Testing of the gate oxide quality takes place, as already described in connection with FIG. 1, by applying a gate test voltage $U_G$ to the measuring pad 14, while a limitation to a voltage compatible with the integrated circuit 42 or the charge pump 44 takes place by the application of a correspondingly lower potential to the measuring pad 16.

The invention is not limited to the exemplary embodiments shown, but is of course applicable in all cases where it is intended to test the gate oxide quality. These can also be, for example, smart power circuits with several integrated power MOS end stages which in that case can be individually tested in accordance with the described testing method.

I claim:

1. A circuit arrangement, comprising: an integrated monocrystaline semiconductor power component having a gate; a first measuring pad; a second measuring pad; and a resistor arranged so that said gate of said power component is connected with said first measuring pad while said first measuring pad is connected with said resistor, said first measuring pad being charged with a gate test voltage which is greater than a gate voltage required for operation of said power component, said power component being integrated with an integrated circuit on a chip, said integrated circuit being connected with said second measuring pad, while said second measuring pad is connected with said resistor, said second measuring pad being charged with an external voltage which is compatible with said integrated circuit.

2. A circuit arrangement as defined in claim 1, and further comprising means for simultaneously applying said gate test voltage and said external voltage so that said gate test voltage is a multiple of an operating voltage of the power component.

3. A circuit arrangement as defined in claim 1, and further comprising a voltage limitation circuit provided for limiting a voltage of said power component.

4. A circuit arrangement as defined in claim 3, wherein said voltage limitation circuit is formed as a bracket branch.

5. A circuit arrangement as defined in claim 3, wherein said voltage limitation circuit is connected between said measuring pad and said resistor and to the drain of the power component.

6. A circuit arrangement for testing a gate oxide of a power component provided with an integrated circuit, the arrangement comprising: a series circuit arranged between the gate oxide of the power component and the integrated circuit and including a first measuring pad, a resistor, and a second measuring pad, said first measuring pad being chargeable with a gate test voltage, said second measuring pad being chargeable with an external voltage which is compatible with said integrated circuit, said gate test voltage and said external voltage being simultaneously applied.

* * * * *